United States Patent
Bang (10) Patent No.: US 9,100,491 B2
(45) Date of Patent: Aug. 4, 2015

(54) MOBILE COMMUNICATION TERMINAL, DIGITAL HEARING AID, AND METHOD OF CONTROLLING THE DIGITAL HEARING AID USING THE MOBILE COMMUNICATION TERMINAL

(75) Inventor: Kyoung-Ho Bang, Seoul (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 1124 days.

(21) Appl. No.: 12/624,074

(22) Filed: Nov. 23, 2009

(65) Prior Publication Data

US 2010/0254540 A1 Oct. 7, 2010

(30) Foreign Application Priority Data

Apr. 6, 2009 (KR) ........................ 10-2009-0029523

(51) Int. Cl.
*H04R 25/00* (2006.01)
*H04M 1/60* (2006.01)
*H04M 1/725* (2006.01)

(52) U.S. Cl.
CPC .......... *H04M 1/6066* (2013.01); *H04M 1/6016* (2013.01); *H04R 25/70* (2013.01); *H04M 1/72569* (2013.01)

(58) Field of Classification Search
None
See application file for complete search history.

(56) References Cited

U.S. PATENT DOCUMENTS

| 5,202,927 | A | * | 4/1993 | Topholm | 381/315 |
| 5,303,306 | A | * | 4/1994 | Brillhart et al. | 381/315 |
| 5,721,783 | A | * | 2/1998 | Anderson | 381/328 |
| 7,020,296 | B2 | * | 3/2006 | Niederdrank | 381/315 |
| 2002/0037087 | A1 | * | 3/2002 | Allegro et al. | 381/317 |
| 2006/0245610 | A1 | * | 11/2006 | Chalupper | 381/321 |
| 2007/0269065 | A1 | * | 11/2007 | Kilsgaard | 381/315 |
| 2008/0101635 | A1 | * | 5/2008 | Dijkstra et al. | 381/315 |
| 2010/0119093 | A1 | * | 5/2010 | Uzuanis et al. | 381/312 |

FOREIGN PATENT DOCUMENTS

| JP | 2002-94619 | 3/2002 |
| KR | 2004-53134 | 6/2004 |
| KR | 10-0585705 | 5/2006 |
| KR | 1020090019474 | 2/2009 |

OTHER PUBLICATIONS

Korean Office Action dated Dec. 29, 2014 in corresponding Korean Patent Application No. 10-2009-0029523, 6 pages.

* cited by examiner

*Primary Examiner* — Duc Nguyen
*Assistant Examiner* — Taunya McCarty
(74) *Attorney, Agent, or Firm* — Staas & Halsey LLP (57) ABSTRACT

A mobile communication terminal interacts with a digital hearing aid and a wireless hearing aid uses the mobile communication terminal. When a user having the mobile communication terminal interworking with the digital hearing aid operates the hearing aid, an amplification function suitable for auditory characteristics of the user is performed. That is, when auditory information of the user is sent to the terminal, the terminal adjusts an amplification gain to prevent the acoustic shock by measuring an environmental signal. The terminal computes an environment profile by analyzing the measured environmental signal and auditory information of the user sent from the hearing aid and automatically adjusts a non-linear amplification level according to a user environment by sending the environment profile to the hearing aid.

14 Claims, 5 Drawing Sheets

MOBILE COMMUNICATION TERMINAL, DIGITAL HEARING AID, AND METHOD OF CONTROLLING THE DIGITAL HEARING AID USING THE MOBILE COMMUNICATION TERMINAL

CROSS-REFERENCE TO RELATED APPLICATIONS

This application claims priority under 35 U.S.C. §119(a) from Korean Patent Application No. 10-2009-29523, filed on Apr. 6, 2009, in the Korean Intellectual Property Office, the disclosure of which is incorporated herein by reference in its entirety.

BACKGROUND

1. Field of the Invention

The present general inventive concept relates to a mobile communication terminal, a digital hearing aid, and a method of controlling the digital hearing aid using the mobile communication terminal, and more particular, to a mobile communication terminal and method capable of providing information about an operation of a digital hearing aid and an environmental situation to a user wearing the hearing aid and controlling the operation of the hearing aid, and a wireless digital hearing aid.

2. Description of the Related Art

In general, a hearing aid is fitted to an ear. An audiologist finely adjusts fitting information (for example, frequency amplification conditions) according to an audiogram of a corresponding user at an initial time. Since the user may be in contact with various noise environments in everyday life, he/she may be inconvenienced when the fitting information is not properly changed according to an environment. It is very troublesome for the user to again wear the hearing aid after detaching the hearing aid from the ear and adjusting the fitting information whenever the user environment is changed. Generally, the user does not adjust the fitting information, and must receive assistance of the audiologist.

Since a digital hearing aid operates in a state in which the hearing aid is fitted to a user's ear, it is difficult for the user to accurately identify an operation state of the hearing aid during everyday life. For example, the user may determine that the hearing aid has failed due to other factors in spite of a state in which a normal operation is disabled due to only an electric power shortage. This inaccuracy may frequently occur because the user cannot accurately recognize the electric power shortage.

When large noise suddenly occurs in a situation where the conventional hearing aid does not receive information in surrounding environments of the user, especially, auditory information, the user may undergo an acoustic shock. When the hearing aid adapted for a specific environment is directly used regardless of an environmental change, that is, when updated fitting information is not received, the user may be inconvenienced in everyday life.

SUMMARY OF THE INVENTION

The present general inventive concept provides a mobile communication terminal and method capable of controlling a hearing aid according to an environmental situation of the hearing aid.

The present general inventive concept further provides a mobile communication terminal capable of reporting a current state (operation, or environment) of a hearing aid to a user.

The present general inventive concept also provides a method of controlling a wireless digital hearing aid using a mobile communication terminal.

The present general inventive concept provides an environment-aware wireless digital hearing aid.

Additional aspects and utilities of the present general inventive concept will be set forth in part in the description which follows and, in part, will be obvious from the description, or may be learned by practice of the general inventive concept.

The foregoing and/or other aspects and utilities of the general inventive concept may be achieved by a mobile communication terminal including a radio unit to communicate with a wireless digital hearing aid, an environment measurer to measure an environmental signal, and a hearing aid controller to output at least one of a control command and information to control the hearing aid by analyzing a measurement result of the environmental signal.

The mobile communication terminal may further include a display to display the measurement result of the environmental signal.

The control information may be an environment profile in which a frequency-specific amplification gain is set according to the environmental signal.

The control command may be an emergency control signal to request the hearing aid to temporarily perform at least one of a muting operation and a sound adjusting operation.

The measured environmental signal may be classified and analyzed as at least one of voice, noise, and sound other than the voice and noise.

The foregoing and/or other aspects and utilities of the general inventive concept may be achieved by a wireless digital hearing aid including a radio unit to communicate with a mobile communication terminal, and a gain controller to perform at least one of an update operation and a temporary adjustment operation on a non-linear amplification gain according to at least one of a control command and information sent from the mobile communication terminal.

The control information may be an environment profile in which a frequency-specific amplification gain is set according to an environmental signal measured by the mobile communication terminal.

The measured environmental signal may be classified and analyzed as at least one of voice, noise, and sound other than the voice and noise.

The foregoing and/or other aspects and utilities of the general inventive concept may be achieved by providing a method of controlling a wireless digital hearing aid using a mobile communication terminal including determining, by the mobile communication terminal, whether the hearing aid is in operation, measuring, by the mobile communication terminal, an environmental signal when the hearing aid is in operation, determining, by the mobile communication terminal, whether a signal level exceeds an allowed range by analyzing a measurement result of the environmental signal, and requesting, by the mobile communication terminal, the hearing aid to update a non-linear amplification gain when the signal level exceeds the allowed range.

The foregoing and/or other aspects and utilities of the general inventive concept may be achieved by providing a method of controlling a wireless digital hearing aid using a mobile communication terminal including determining, by the mobile communication terminal, whether the hearing aid is in operation, receiving, by the mobile communication terminal, auditory characteristics of a user from the hearing aid when the hearing aid is in operation, and measuring an environmental signal, generating, by the mobile communication terminal, an environment profile by analyzing a measurement result of the environment signal, and requesting, by the mobile communication terminal, the hearing aid to update a non-linear amplification gain by sending the environment profile to the hearing aid.

The foregoing and/or other aspects and utilities of the general inventive concept may be achieved by providing a method of controlling a wireless digital hearing aid using a mobile communication terminal including determining, by the mobile communication terminal, whether the hearing aid is in operation, measuring, by the mobile communication terminal, an environmental signal when the hearing aid is in operation, determining, by the mobile communication terminal, whether a signal level exceeds an allowed range by analyzing a measurement result of the environmental signal, and sending, by the mobile communication terminal, an emergency control signal to the hearing aid so that the hearing aid temporarily adjusts sound to be output when the signal level exceeds the allowed range.

The determining whether the signal level exceeds the allowed range includes receiving, by the mobile communication terminal, auditory characteristics of a user from the hearing aid, the auditory characteristics of the user being referred to along with the analyzed measurement result of the environment signal.

The analyzing the measured environment signal includes dividing voice, noise, and sound other than the voice and noise.

The method of controlling a wireless digital hearing aid using a mobile communication terminal further includes displaying the measurement result of the environmental signal.

The foregoing and/or other aspects and utilities of the general inventive concept may be achieved by providing a hearing aid system having a wireless digital hearing aid and a mobile communication terminal including a radio unit in the mobile communication terminal to communicate with the wireless digital hearing aid, a radio unit in the wireless digital hearing aid to communicate with the mobile communication terminal, and an environment measure to measure an environmental signal, wherein the mobile communication terminal includes a hearing controller to output at least one of a control command and information to control the hearing aid by analyzing a measurement result of the environmental signal, and wherein the wireless digital hearing aid includes a gain controller to perform at least one of an update operation and a temporary adjustment operation on a non-linear amplification gain according to the at least one of the control command and information sent from the mobile communication terminal.

The hearing aid system further includes a display to display the measurement result of the environmental signal.

The control information may be an environment profile in which a frequency-specific amplification gain is set according to the environmental signal.

The control command may be an emergency control signal to request the hearing aid to temporarily perform at least one of a muting operation and a sound adjusting operation.

The measured environmental signal may be classified and analyzed as at least one of voice, noise, and sound other than the voice and noise.

The foregoing and/or other aspects and utilities of the general inventive concept may be achieved by providing a mobile communication terminal used to control a hearing aid including a radio unit to receive a signal representing auditory information from a hearing aid, a mobile processor to receive another signal from an external terminal, and a controller to process the another signal to generate sound or image, to process sound or image to output the processed sound or image to the external terminal, and to process the signal representing the auditory information to output an environmental signal to the hearing aid to control the hearing.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

According to an embodiment of the present general inventive concept, a mobile communication terminal and a wireless digital hearing aid perform a digital-signal processing algorithm, thereby providing the convenience of use of the hearing aid by utilizing a radio communication channel.

According to an embodiment of the present invention, a user wearing a digital hearing aid may control the hearing aid by collecting information about a current use place (for example, an airport, a taxi, or a cafeteria) through a portable terminal. Specifically, the terminal may receive an environmental signal, analyze the received signal in a frequency domain, and compute an optimum profile suitable for each environment using auditory information of the user received from the digital hearing aid. The profile may be updated in real time, periodically, or according to need.

Figure 1:
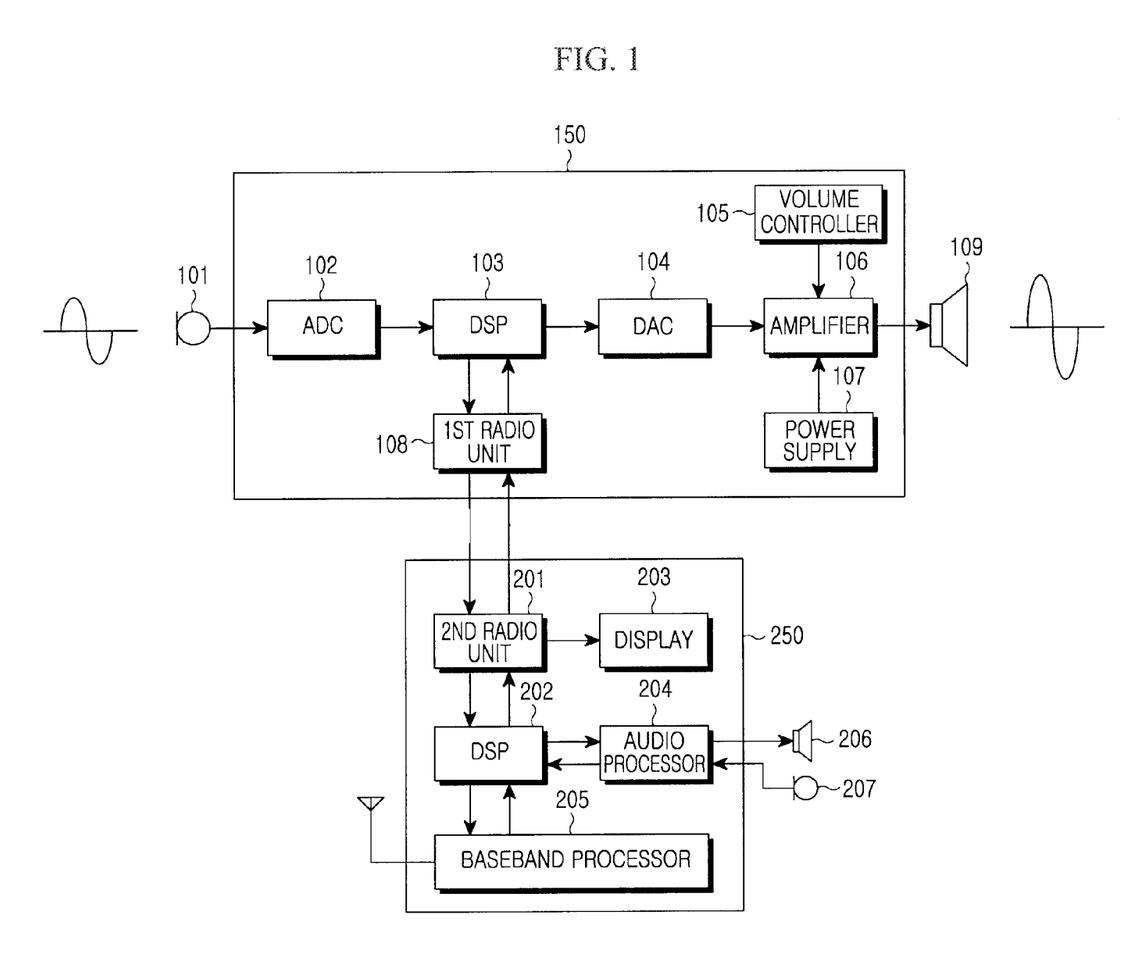
FIG. 1 illustrates a structure of a hearing aid system according to an embodiment of the present invention.

FIG. 1 illustrates a structure of a hearing aid system according to an embodiment of the present general inventive concept.

As illustrated in FIG. 1, the hearing aid system includes a wireless digital hearing aid 150 and a mobile communication terminal 250.

The wireless hearing aid 150 includes a microphone 101, an analog to digital converter (ADC) 102, a digital signal processor (DSP) 103, a digital to analog converter (DAC) 104, a volume controller 105, an amplifier 106, a power supply 107, a first radio unit 108, and a receiver 109.

The microphone 101 is provided on an outer portion of the hearing aid fitted to a user's ear to receive an analog signal around the ear and outputs the received analog signal to the ADC 102. The ADC 102 converts the analog signal output from the microphone 101 into a digital signal. The DSP 103 performs digital signal processing such as noise cancellation, feedback control, or non-linear amplification required by the hearing aid for the digital signal output from the ADC 102, and then outputs the processed signal to the DAC 104. The DSP 103 processes noises and sounds of the user's current environment and creates auditory information (for example, an audiogram) representative of noises and sounds in the user's current environment. The DSP 103 sends the auditory information of the user to the mobile communication terminal 250 through the radio unit 108. The mobile communication terminal 250 may create an environment profile including control information to be sent to the DSP 103.

The mobile communication terminal 250 may also send a control command to the DSP 103. The control command may be an emergency control signal to request the hearing aid to temporarily perform, for example, a muting operation and a sound adjusting operation. The environment profile may set a frequency-specific amplification gain to be represented by an environmental signal generated by the mobile communication terminal 250. The DSP 103 may receive the control command and the environmental signal from the mobile communication terminal 250 through the radio unit 108. The control command and the environmental signal may be reflected in a signal to be output to the DAC 104.

The volume controller 105 adjusts a gain value of the amplifier 106 using information based on manipulation of the user. The amplifier 106 amplifies a signal at power of the power supply 107 by applying the gain value adjusted by the volume controller 105 to the analog signal received from the DAC 104. The receiver 109 reproduces an audible signal from the output signal of the amplifier 106.

The DSP 103 or the amplifier 106 may constitute a gain controller to update or temporarily adjust a non-linear amplification gain, for example, the frequency-specific amplification gain according to a control command or information sent from the mobile communication terminal 250.

The mobile communication terminal 250 includes a second radio unit 201, a DSP 202, a display 203, an audio processor 204, a baseband processor 205, a receiver 206, and a microphone 207.

Here, the DSP 202, the display 203, the audio processor 204, the baseband processor 205, the receiver 206, and the microphone 207 may be referred to as a mobile processor to perform a conventional operation of the mobile communication terminal 250, such as wireless communication with another mobile communication terminal to receive and transmit a signal, process the signal, and control the receiver 206 and the microphone 207.

The radio unit 201 receives auditory information of the user and system information of residual power energy from the radio unit 108 of the wireless digital hearing aid 150, and outputs the received information to the DSP 202 and the display 203. The radio unit 201 sends the environmental signal representative of the user's environment profile to the radio unit 108. That is, for example, the radio unit 201 may send control information input from the DSP 202 to the radio unit 108 of the wireless digital hearing aid 150.

The DSP 202 processes the control information input from the radio unit 201, the baseband processor 205, and the audio processor 204, and then outputs the processed control information to the radio unit 201, the baseband processor 205, and the audio processor 204. The microphone 207, the audio processor 204, and the DSP 202 may constitute an environment measurer to measure the environmental signal. The DSP 202 may be a hearing aid controller that may analyze a result of measuring the environmental signal, output the control command or control information to control the hearing aid 150, and send the control command or control information through the radio unit 201.

The audio processor 204 receives voice, noise, and sound other than the voice and noise (that is, an environmental signal) from the microphone 207 and outputs a signal to the DSP 202. A processed signal is received from the DSP 202 and an audible signal is output through the receiver 206.

The baseband processor 205 may be responsible for voice communication and data communication, and exchanges voice and data with the DSP 202.

Figure 2:
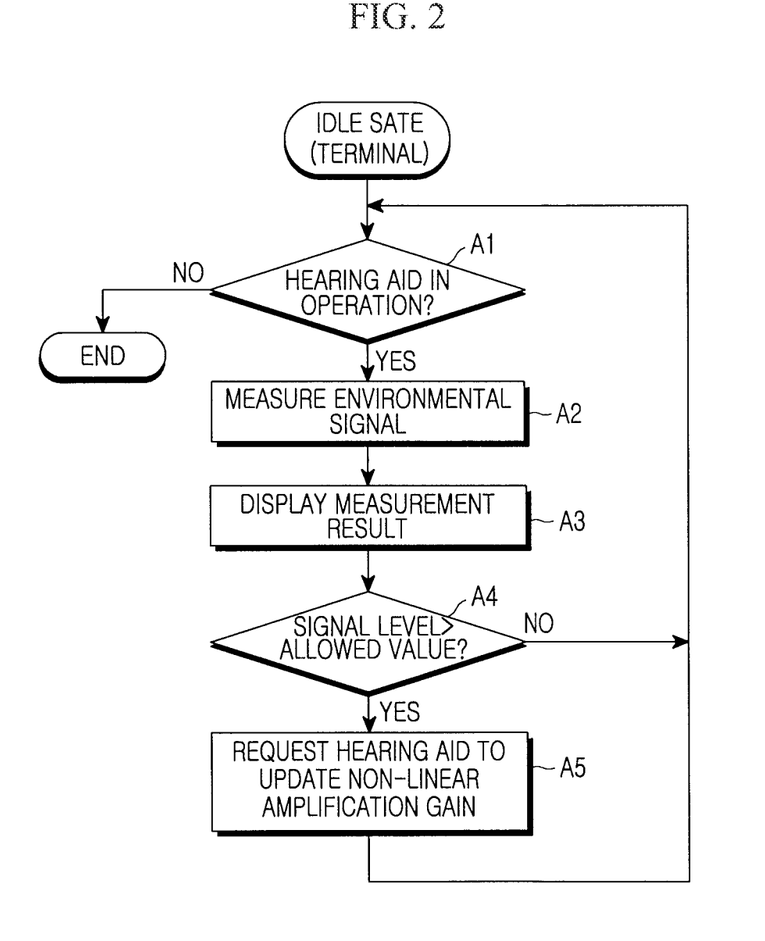
FIG. 2 is a flowchart illustrating a method of controlling a wireless digital hearing aid according to an embodiment of the present general inventive concept.

FIG. 2 is a flowchart illustrating a method of controlling a wireless digital hearing aid according to an embodiment of the present general inventive concept.

As illustrated in FIG. 2, in operation A1, a terminal of an idle state checks whether the hearing aid is in operation. If it is determined that the hearing aid is not in operation, a task is terminated. It may be determined, for example, that the hearing aid is in operation if a response is received by sending a signal to the hearing aid, and that the hearing aid is not in operation if no response is received.

If it is determined that the hearing aid is in operation, the terminal measures an environmental signal in operation A2. The environmental signal may be classified as voice, noise, or other sound (for example, music).

In operation A3, the measurement result of operation A2 is displayed. Operation A3 may be optionally performed. That is, operation A3 may be performed so that the user may visually recognize the measurement result of the environmental signal, or may not be performed. When the user visually recognizes the measurement result of the environmental signal, he/she may cope with an unexpected situation (for example, sudden large noise or temporary hearing impairments due to environmental factors).

In operation A4, the terminal analyzes the measurement result of the environmental signal and checks whether a signal level exceeds an allowed range. In this embodiment, it may be determined that the signal level exceeds the allowed range when the signal level is greater than an allowed value. In this case, when the signal level does not exceed the allowed range, the terminal directly maintains the idle state without a subsequent task.

When the signal level exceeds the allowed range, the terminal requests the hearing aid to update a non-linear amplification gain in operation A5. Although not illustrated, the hearing aid updates the non-linear amplification gain according to a non-linear amplification gain update request received from the terminal. That is, in FIG. 1, a non-linear amplification gain update request a2 is sent to the first radio unit 108 of the hearing aid 150 through the second radio unit 201 of the terminal 250, thereby controlling a gain of the DSP 103 of the hearing aid 150.

Figure 3:
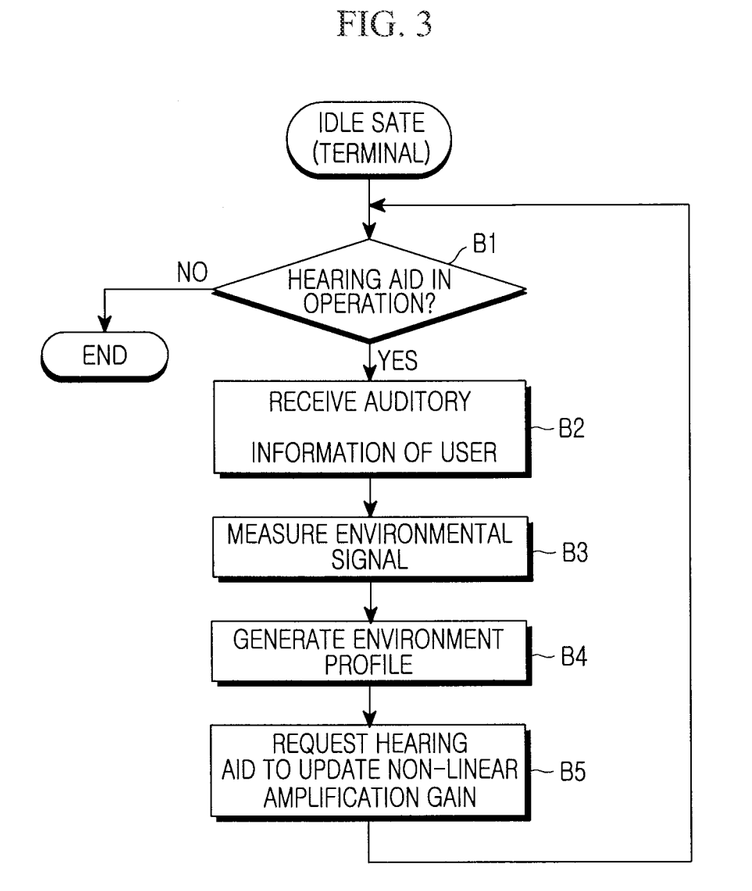
FIG. 3 is a flowchart illustrating a method of controlling a wireless digital hearing aid according to an embodiment of the present general inventive concept.

FIG. 3 is a flowchart illustrating a method of controlling a wireless digital hearing aid according to an embodiment of the present general inventive concept.

As illustrated in FIG. 3, in operation B1, the terminal of the idle state checks whether the hearing aid is in operation. If it is determined that the hearing aid is not in operation, a task is terminated.

If the hearing aid is in operation, the terminal receives auditory information of the user from the hearing aid in operation B2. A transmission of the auditory information of the user may be preset or performed by a request of the hearing aid.

In operation B3, the terminal measures an environmental signal. Although not illustrated, the measurement result can be displayed in operation B3. Like operation A3 of FIG. 2 as described above, operation B3 is optionally performed.

In operation B4, the terminal analyzes the measurement result of the environmental signal and generates an environment profile in which a frequency-specific amplification gain is set.

In operation B5, the terminal requests the hearing aid to update the non-linear amplification gain by sending the environment profile thereto. Although not illustrated, the hearing aid updates the non-linear amplification gain by referring to the environment profile received from the terminal.

In operation B5, the terminal maintains the idle state after requesting the hearing aid to update the non-linear amplification gain.

Figure 4:
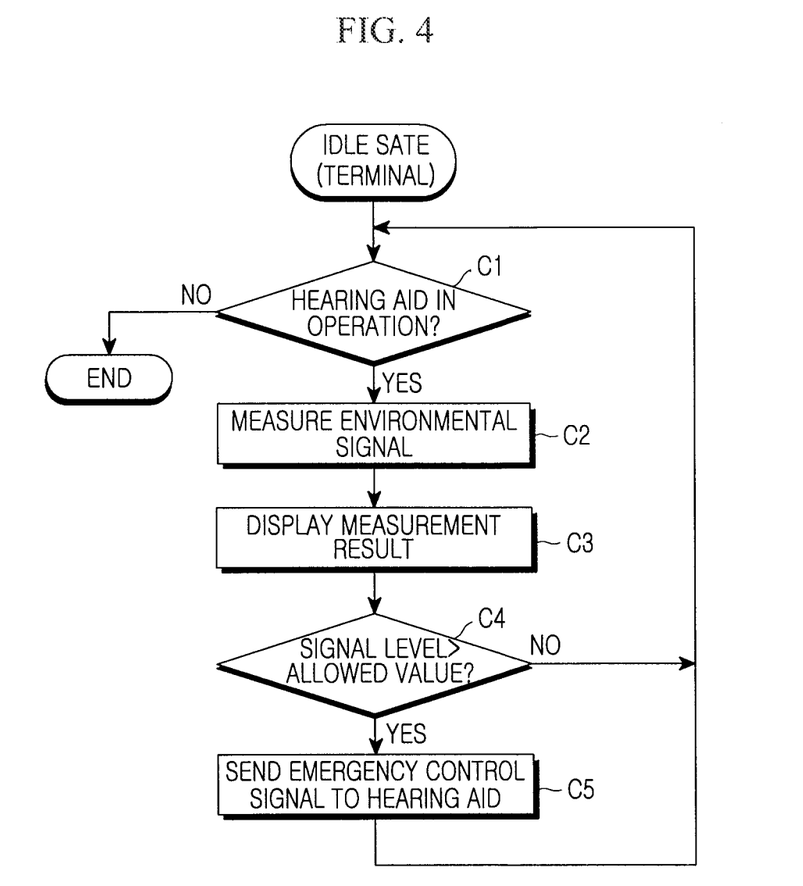
FIG. 4 is a flowchart illustrating a method of controlling a wireless digital hearing aid according to an embodiment of the present general inventive concept.

FIG. 4 is a flowchart illustrating a method of controlling a wireless digital hearing aid according to an embodiment of the present general inventive concept.

As illustrated in FIG. 4, in operation C1, the terminal of the idle state checks whether the hearing aid is in operation. If it is determined that the hearing aid is not in operation, a task is terminated.

If the hearing aid is in operation in operation C1, the terminal measures an environmental signal in operation C2.

In operation C3, the measurement result of operation C2 is displayed. As described above, operation C3 may be optionally performed.

In operation C4, the terminal analyzes the measurement result of the environmental signal and checks whether a signal level exceeds an allowed range. In this case, if it is determined that the signal level does not exceed the allowed range, the idle state is directly maintained without a subsequent task.

However, if the signal level exceeds the allowed range, the terminal sends an emergency control signal to the hearing aid in operation C5. Although not illustrated, the hearing aid may protect the user's hearing ability by preventing sound from being output to the receiver 109 and amplified according to the emergency control signal received from the terminal.

Figure 5:
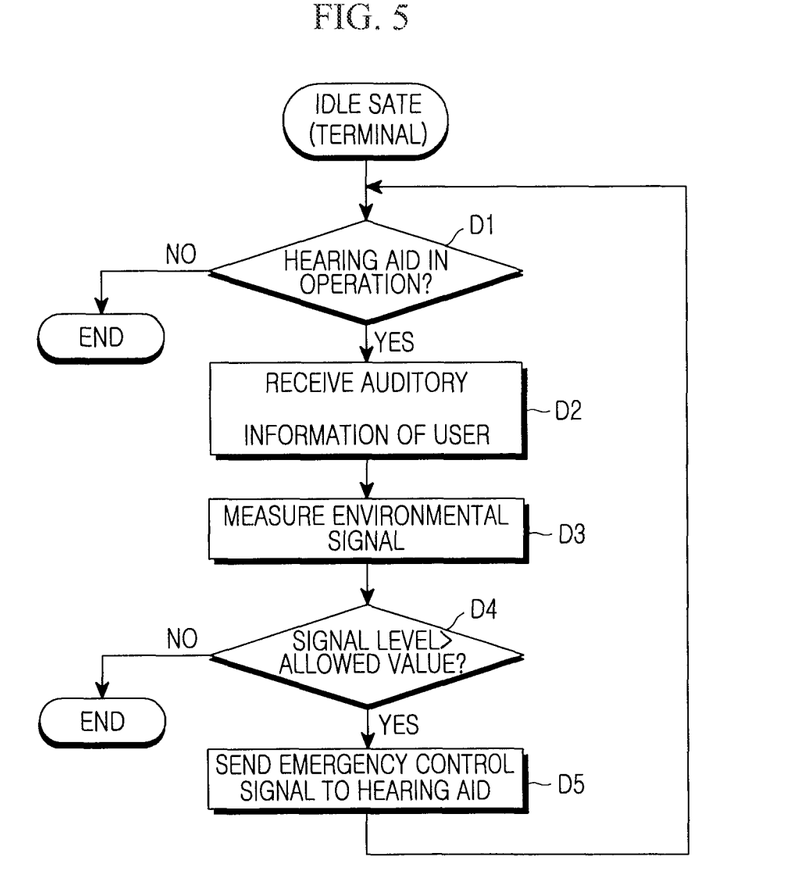
FIG. 5 is a flowchart illustrating a method of controlling a wireless digital hearing aid according to an embodiment of the present general inventive concept.

FIG. 5 is a flowchart illustrating a method of controlling a wireless digital hearing aid according to an embodiment of the present general inventive concept.

In operation D1, the terminal of the idle state checks whether the hearing aid is in operation. If it is determined that the hearing aid is not in operation, a task is terminated.

If the hearing aid is in operation, the terminal receives auditory information of the user from the hearing aid in operation D2. The transmission of the auditory information of the user may be preset or performed by a request of the hearing aid.

In operation D3, the terminal measures an environmental signal. Although not illustrated, the measurement result can be displayed in operation D3. Like operation A3 of FIG. 2 as described above, operation D3 is optionally performed.

In operation D4, the terminal analyzes the measurement result of the environmental signal and checks whether a signal level exceeds an allowed range. In this case, if it is determined that the signal level does not exceed the allowed range, the idle state is directly maintained without a subsequent task.

However, if the signal level exceeds the allowed range, the terminal sends an emergency control signal to the hearing aid in operation D5. Although not illustrated, the hearing aid may protect the user's hearing ability by preventing sound from being output to the receiver 109 and amplified according to the emergency control signal received from the terminal.

The present general inventive concept makes it possible for a terminal and a digital hearing aid to interact with each other, thereby allowing a user to check a currently operating state of the hearing aid or a power state through the terminal. Therefore, the hearing aid may be prevented from performing an abnormal operation due to an electric power shortage and the hearing aid user may visually or tactually sense environmental information (mainly, auditory information), thereby reducing an unpleasant feeling or fright when a sudden situation such as large noise occurs. The terminal measures and processes a voice/audio signal and a noise signal around the hearing aid user and updates a profile of the digital hearing aid. Therefore, an environment-aware digital hearing aid may be provided using a terminal, the convenience for a user may be promoted, and a terminal function may be diversified.

The present general inventive concept may also be embodied as computer-readable codes on a computer-readable medium. The computer-readable medium may include a computer-readable recording medium and a computer-readable transmission medium. The computer-readable recording medium is any data storage device that may store data that may be thereafter read by a computer system. Examples of the computer-readable recording medium include read-only memory (ROM), random-access memory (RAM), CD-ROMs, magnetic tapes, floppy disks, and optical data storage devices. The computer-readable recording medium may also be distributed over network coupled computer systems so that the computer-readable code is stored and executed in a distributed fashion. The computer-readable transmission medium may transmit carrier waves or signals (e.g., wired or wireless data transmission through the Internet). Also, functional programs, codes, and code segments to accomplish the present general inventive concept may be easily construed by programmers skilled in the art to which the present general inventive concept pertains.

Although various example embodiments of the present general inventive concept have been illustrated and described, it will be appreciated by those skilled in the art that changes may be made in these embodiments without departing from the principles and spirit of the present general inventive concept, the scope of which is defined in the appended claims and their equivalents.

What is claimed is:

1. A mobile communication terminal, comprising:
   a radio unit to communicate with an external wireless digital hearing aid;
   an environment measurer to measure an environmental signal; and
   a hearing aid controller to generate an environment profile, to output a control signal including the environment profile to the external wireless digital hearing aid, where the control signal includes the environment profile in which a frequency-specific amplification gain is set according to the environmental signal.

2. The mobile communication terminal of claim 1, wherein the hearing aid controller outputs a control command that is an emergency control signal to request the hearing aid to temporarily perform at least one of a muting operation and a sound adjusting operation.

3. The mobile communication terminal of claim 1, wherein the measured environmental signal is classified and analyzed as at least one of voice, noise, and sound other than the voice and noise.

4. A wireless digital hearing aid, comprising:
   a radio unit to communicate with an external mobile communication terminal;
   an input unit to receive an audio signal other than one from the external mobile communication terminal, and
   a gain controller to perform at least one of an update operation and a temporary adjustment operation on a non-linear amplification gain according to a control signal including an environment profile sent from the mobile communication terminal, where the control signal includes the environment profile in which a frequency-specific amplification gain is set according to an environmental signal measured by the mobile communication terminal.

5. The wireless digital hearing aid of claim 4, wherein a measured environmental signal is classified and analyzed as at least one of voice, noise, and sound other than the voice and noise.

6. A method of controlling a wireless digital hearing aid using a mobile communication terminal, the method comprising:

determining, by the mobile communication terminal, whether the hearing aid is in operation;

measuring, by the mobile communication terminal, an environmental signal when the hearing aid is in operation;

determining, by the mobile communication terminal, whether a signal level exceeds an allowed range by analyzing a measurement result of the environmental signal; and     requesting, by the mobile communication terminal, the hearing aid to update a non-linear frequency-specific amplification gain according to a control signal,     where the control signal includes an environment profile in which the non-linear frequency specific amplification gain is set according to the environmental signal.

7. A method of controlling a wireless digital hearing aid using a mobile communication terminal, the method comprising:

determining, by the mobile communication terminal, whether the hearing aid is in operation;

receiving, by the mobile communication terminal, auditory characteristics of a user from the hearing aid when the hearing aid is in operation, and measuring an environmental signal;

generating, by the mobile communication terminal, an environment profile by analyzing a measurement result of the environmental signal; and     requesting, by the mobile communication terminal, the hearing aid to update a non-linear frequency-specific amplification gain according to a control signal, where the control signal includes the environmental profile in which the non-linear frequency specific amplification gain is set according to the environmental signal.

8. A method of controlling a wireless digital hearing aid using a mobile communication terminal, the method comprising:

determining, by the mobile communication terminal, whether the hearing aid is in operation;

measuring, by the mobile communication terminal, an environmental signal when the hearing aid is in operation;

determining, by the mobile communication terminal, whether a signal level exceeds an allowed range by analyzing a measurement result of the environmental signal; and     sending, by the mobile communication terminal, an emergency control signal to the hearing aid so that the hearing aid temporarily adjusts a frequency-specific amplification gain, where the emergency control signal includes an environmental profile in which the frequency specific amplification gain is set according to the environmental signal.

9. The method of claim 8, wherein determining whether the signal level exceeds the allowed range includes receiving, by the mobile communication terminal, auditory characteristics of a user from the hearing aid, the auditory characteristics of the user being referred to along with the analyzed measurement result of the environmental signal.

10. The method of claim 8, wherein analyzing the measured environmental signal comprises dividing voice, noise, and sound other than the voice and noise.

11. A hearing aid system having a wireless digital hearing aid and a mobile communication terminal, comprising:

a radio unit in the mobile communication terminal to communicate with the wireless digital hearing aid;

a radio unit in the wireless digital hearing aid to communicate with the mobile communication terminal; and     an environment measurer to measure an environmental signal,     wherein the mobile communication terminal includes a hearing aid controller to output a control signal to control the hearing aid, where the control signal includes an environment profile in which a frequency-specific amplification gain is set according to the environmental signal.

12. The hearing aid system of claim 11, further comprising:

a display to display a measurement result of the environment signal.

13. The hearing aid system of claim 11, wherein the mobile communication terminal outputs a control command that is an emergency control signal to request the hearing aid to temporarily perform at least one of a muting operation and a sound adjusting operation.

14. The hearing aid system of claim 11, wherein the measured environmental signal is classified and analyzed as at least one of voice, noise, and sound other than the voice and noise.

* * * * *